(12) United States Patent
Shimada

(10) Patent No.: US 7,381,062 B2
(45) Date of Patent: Jun. 3, 2008

(54) ELECTRICAL CONTACT AND SOCKET FOR ELECTRICAL PARTS

(75) Inventor: Hideo Shimada, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 11/830,007

(22) Filed: Jul. 30, 2007

(65) Prior Publication Data

US 2008/0032529 A1    Feb. 7, 2008

(30) Foreign Application Priority Data

Aug. 2, 2006    (JP)    ............................ 2006-210698

(51) Int. Cl.
*H01R 12/00*    (2006.01)
(52) U.S. Cl. ........................................ 439/66; 439/700
(58) Field of Classification Search ............... 439/65, 439/66, 70, 74, 700
See application file for complete search history.

(56) References Cited

U.S. PATENT DOCUMENTS 5,013,249 A * 5/1991 Lindeman et al. ............ 439/66
5,403,194 A * 4/1995 Yamazaki .................... 439/66
5,997,315 A * 12/1999 Akama et al. ................ 439/66
6,951,482 B1 * 10/2005 Miller et al. ................ 439/581

FOREIGN PATENT DOCUMENTS

JP    10-239349    9/1998

* cited by examiner

*Primary Examiner*—Khiem Nguyen
(74) *Attorney, Agent, or Firm*—Staas & Halsey LLP

(57) ABSTRACT

The present invention is to provide an electrical contact and a socket for electrical parts which can be produced easily, at low cost and is light in weight. The contact pin 15 comprises a first contact member 26 having a first contact portion 26*d* to be contacted with an IC package 12, wherein the first contact member 26 is formed into a cylindrical shape by curling an electroconductive plate, a blocking piece 26*e* is formed at a middle portion of the cylindrical shape by making a cut in the middle portion, and the blocking piece 26*e* is bent toward an inside of the cylindrical shape in such a manner that the blocking piece, in a plan view, blocks a through hole that runs vertically through the inside of the cylindrical shape.

5 Claims, 12 Drawing Sheets

PRIOR ART

ELECTRICAL CONTACT AND SOCKET FOR ELECTRICAL PARTS

BACKGROUND OF THE INVENTION

1. Field of the Invention

The present invention relates to an electrical contact to be electrically connected with a first electrical part such as a semiconductor device (herein after called "IC package"), etc. and to a socket for electrical parts in which the electrical contact is disposed.

2. Prior Art of the Invention

In a known art, there has been provided an electrical contact of this kind, for example, as shown in FIG. 14 (Patent Document 1: Japanese unexamined Patent Publication No. JP H10-239349 A1). This electrical contact 1 comprises a plunger 2 and a spring member 3 and is held by both an upper-side holding member 5 and a lower-side holding member 6 of the socket body 4. The electrical contact 1 is structured to make an electrical connection between a wiring board 7 and an electrical part ("IC package", not shown) which is accommodated on an upper side of the electrical contact.

More precisely, the plunger 2 has a contact portion 2a to be contacted with the electrical part at an upper end portion thereof, a flange portion 2b at a middle portion thereof for retaining the plunger, and a shaft portion 2c formed on a lower side of the flange portion 2b.

Further, the spring member 3 comprises a normally-wound portion 3a in which a wire member is retractably wound and a closely-wound portion 3b in which the wiring member is closely wound. Both wound portions are disposed continuously in the vertical direction. The shaft portion 2c of the plunger 2 is inserted into the normally-wound portion 3a. Electrical connection can be established by making contact between the spring member 3 and the plunger 2, and the closely-wound portion 3b of the spring member 3 is structured to be electrically connected with an electrode portion 7a of the wiring board 7.

In such type of contact pin, when the electrical part ("IC package") is accommodated on the upper side of the plunger 2 and then the plunger 2 is pushed down by the electrical part, the normally-wound portion 3a of the spring member 3 is compressed and thus the plunger 2 is moved downward. When this compression force acts on the contact portion 2a of the plunger 2 and the closely-wound portion 3b of the spring member 3, the contact portion 2a contacts a terminal of the electrical part and the closely-wound portion 3b contacts the electrode portion 7a of the wiring board 7 with a predetermined pressure respectively.

At this stage, the terminal of the electrical part and the electrode portion 7a of the wiring board 7 can be electrically connected, and then burn-in test, etc. of the electrical part ("IC package") are carried out.

In such known contact pin, however, the plunger 2 is formed from a rod-like pin through cutting work, so that the shape forming of such plunger is time-consuming and cost-increasing. In addition, the resulting plunger itself is heavy, being inconvenient. In particular, the cutting work for producing a crown-like shape contact portion 2a which is to be contacted with the IC package, is time-consuming.

SUMMARY OF THE INVENTION

It is therefore an object of the present invention to provide an electrical contact and a socket for an electrical part, which are light in weight and can be easily produced at low cost.

The above objects can be achieved, in one aspect, by providing an electrical contact which comprises a first contact member having a first contact portion to be contacted with a first electrical part, wherein the first contact member is formed into a cylindrical shape by curling an electroconductive plate, a blocking piece is formed at a middle portion of the cylindrical shape by making a cut in the middle portion, and the blocking piece is bent toward an inside of the cylindrical shape in such a manner that the blocking piece, in a plan view, blocks a through hole that runs vertically through the inside of the cylindrical shape.

In another aspect of the present invention, the objects can also be achieved by providing an electrical contact which comprises a first contact member having a first contact portion to be contacted with a first electrical part;

a second contact member having a second contact portion to be contacted with a second electrical part, the second contact member being disposed at a lower side of the first contact member; and an urging means for urging the first and the second contact member in a direction opposite to each other, wherein, the first contact member is formed into a cylindrical shape by curling an electroconductive plate, a blocking piece is formed at a middle portion of the cylindrical shape by making a cut in the middle portion, and the blocking piece is bent toward an inside of the cylindrical shape, in such a manner that the blocking piece, in a plan view, blocks a through hole that runs vertically through an inside of the cylindrical shape.

In a preferred embodiment, the first contact portion of the first contact member is formed into a crown-like shape.

In another preferred embodiment, a plurality of blocking pieces are formed on the first contact member and the plurality of blocking pieces, in a plan view, block the through hole that runs vertically through the inside of the cylindrical shape.

In still another aspect of the present invention, the objects can be achieved by providing a socket for an electrical part which comprises a socket body to be disposed on a wiring board and to accommodate a first electrical part on an upper side of the socket body, and a plurality of electrical contacts which are described above and are disposed in the socket body.

According to the present invention, the first contact member is formed into a cylindrical shape by curling an electroconductive plate and a blocking piece is formed at a middle portion of the cylindrical shape by making a cut in the middle portion. The blocking piece is bent toward an inside of the cylindrical shape in such a manner that the blocking piece, in a plan view, blocks a through hole that runs vertically through the inside of the cylindrical shape. Therefore, when foreign materials enter into the cylindrical shape from an upper-end opening of the first contact portion of the cylindrical shape, the foreign materials pile up on the blocking piece, being able to prevent the foreign materials from further falling down and intruding into the lower side. Accordingly, the foreign materials are not bitten by the coil spring and the sliding portion, etc. Thus occurrence of poor electrical connections or operability can be avoided.

In addition, the blocking piece can be formed, in one body, at the time the first contact member is formed, being easier to manufacture and lower in production cost when compared with other structures having the same function as that of the blocking piece.

Further the first contact member is formed into a cylindrical shape not by cutting work but by curling an electroconductive plate, being easier to manufacture, lower in production cost and light in weight of the contact pin.

According to the preferred embodiment, the first contact portion of the first contact member is formed into a crown-like shape, so that the crown-like first contact portion can be produced much easily through pressing work when compared with the same contact portion made through cutting work.

According to another preferred embodiment, a plurality of blocking pieces are formed on the first contact member and this blocking pieces, in a plan view, block the through hole that runs vertically through the inside of the cylindrical shape. Therefore, the plurality of blocking pieces can be formed arbitrarily over a wider range, being able to improve its design flexibility.

According to the still another aspect of the present invention, the socket for an electrical part comprises a socket body to be disposed on a wiring board and to accommodate a first electrical part on an upper side of the socket body, and a plurality of electrical contacts which are described above and are disposed in the socket body. Therefore, since the socket for an electrical part has a plurality of electrical contacts mentioned above, the socket for an electrical part of the present invention exerts an excellent effect as a whole.

BRIEF DESCRIPTION OF THE DRAWINGS

In the accompanying drawings:

FIG. 4A is a front view and FIG. 4B is a sectional view taken along the line IVB-IVB in FIG. 4A;

DETAILED DESCRIPTION

Figure 1:
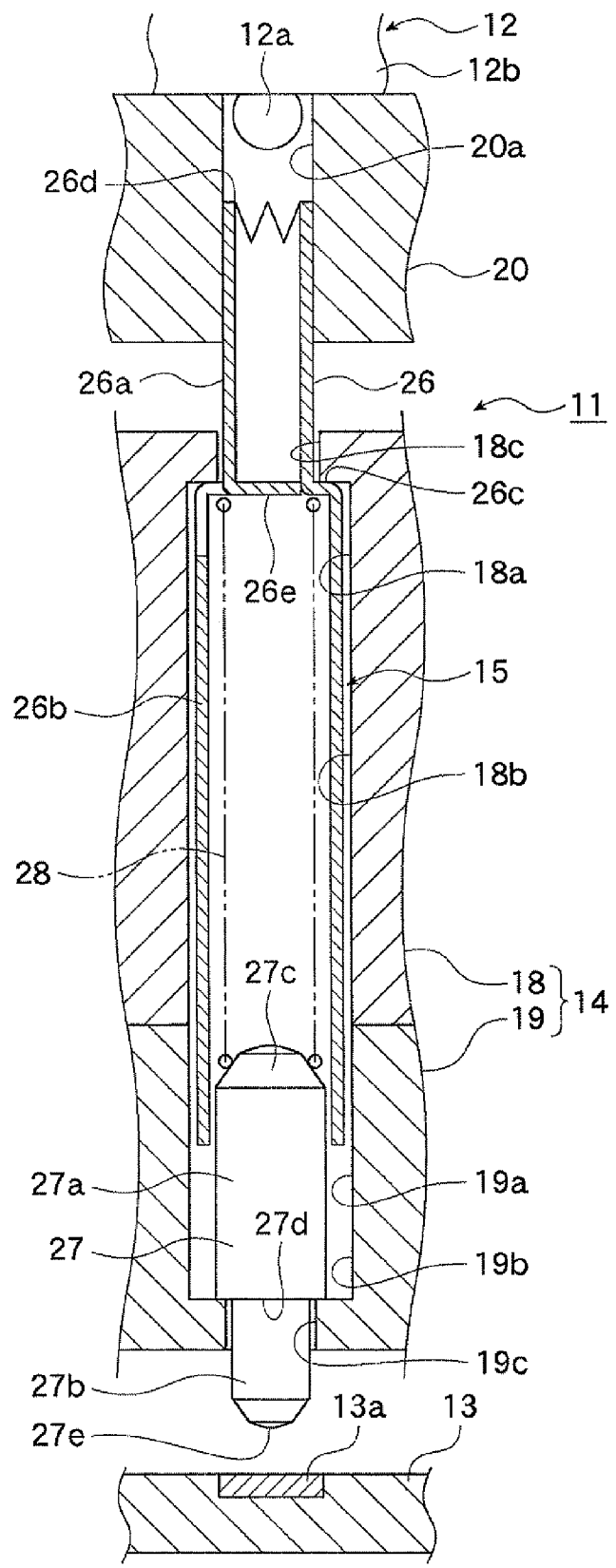
FIG. 1 is a sectional view of an essential portion of an IC socket according to a first embodiment.

Preferred embodiments of the present invention will be described hereunder with reference to the accompanying drawings.

First Embodiment

FIGS. 1 to 5 represent a first embodiment of the present invention. Further, it is to be noted that terms "right", "upper", "lower" and the like are used herein with reference to the illustrated state on the drawings or in a generally using state of a contact pin or a socket for electrical parts.

Firstly, the structure of the first embodiment will be explained. Reference numeral 11 shows an IC socket as a "socket for electrical parts". This IC socket 11 accommodates an IC package 12 as a "first electrical part" to establish an electrical connection between this IC package 12 and a wiring board 13 as a "second electrical part" through the IC socket 11.

The IC package 12 is what is called a BGA (Ball Grid Array) type. A plurality of sphere-like solder balls 12a as a plurality of "terminals" are formed on a lower surface of a square-like IC package body 12b.

The IC socket 11 has a socket body 14 to be disposed on the wiring board 13. In the socket body 14, a plurality of contact pins 15 as "electrical contacts" are arranged. In FIG. 1, one contact pin 15 is only illustrated, but a plurality of contact pins are arranged in an actual state.

The socket body 14, as shown in FIG. 1, has an upper-side holding member 18 and a lower-side holding member 19, each having holding openings 18a or 19a into which the contact pin 15 is inserted and held. Both holding members are secured to the socket body by bolts (not shown) In addition, a floating plate 20 is vertically movably attached on the upper side of the upper-side holding member 18 by a guide pin (not shown) and urged upward by a spring (not shown) and is structured to be stopped at a predetermined height.

An upper-side portion of the contact pin 15 is inserted into an insertion hole 20a of the floating plate 20.

The contact pin 15 comprises a first contact member 26 to be electrically connected with the IC package 12, a second contact member 27 to be electrically connected with the wiring board 13 and a coil spring 28 as "urging means" for urging the first and the second contact member 26, 27 in the opposite direction to each other.

The first contact member 26 is formed into a cylinder-like shape through a curling process using an electroconductive plate. The cylinder-like shape has a small-diameter cylindrical shape portion 26a on the upper side thereof and a large-diameter cylindrical shape portion 26b on a lower side thereof. There is a step portion 26c formed between the small- and the large-diameter cylindrical shape portion 26a, 26b.

At the upper end portion of the small-diameter cylindrical shape portion 26a, a crown-like shape first contact portion 26d is formed to be contacted with the solder ball 12a.

A blocking piece 26e is formed at the step portion 26c, by making a cut in the first contact member 26 so as to make the blocking piece surrounded by the cut but still connected with the cylindrical shape, and by bending the blocking piece orthogonally toward an inside of the cylindrical shape. The blocking piece 26e which extends horizontally is structured so as, in a plan view seen from the axial direction of the first contact member 26, to block a through hole of the small-diameter cylindrical shape portion 26a and also to form a bottom-like portion of the small-diameter cylindrical shape portion 26a. The blocking piece 26e is formed into a circular shape by making a cut at a portion under the step portion 26c and raising it up.

On the other hand, the second contact member 27 is formed from an electroconductive rod-like member through cutting work and comprises a large-diameter pillar-like portion 27a on an upper side thereof, a small-diameter pillar-like portion 27b under the large-diameter pillar-like portion and a step portion 27d between the large- and the small-diameter pillar-like portion 27a, 27b. The large-diameter pillar-like portion 27a is vertically and movably inserted into the large-diameter cylindrical shape portion 26b of the first contact member 26 and the upper end portion 27c is formed into a taper-like shape. The upper end portion 27c is fitted to a lower end portion of the coil spring 28. An upper end portion of the coil spring 28 abuts on an inner surface side (lower surface side) of the step portion 26c of the first contact member 26 so that the coil spring 28 is placed between the first contact member 26 and the second contact member 27.

At the lower end portion of the small-diameter pillar-like portion 27b of the second contact member 27, a second contact portion 27e which abuts on the electrode portion 13a of the wiring board 13 is formed.

The large-diameter cylindrical shape portion 26b of the first contact member 26 of the contact pin 15 having such structure mentioned above is vertically and movably inserted into a large-diameter opening portion 18b of the holding opening 18a of the upper-side holding member 18 and the small-diameter cylindrical shape portion 26a of the first contact member 26 is inserted into a small-diameter opening portion 18c of the holding opening 18a of the upper side holding member 18 and projected upward.

On the other hand, the large-diameter pillar-like portion 27a of the second contact member 27 of the contact pin 15 is inserted into a large-diameter opening portion 19b of the holding opening 19a of the lower-side holding member 19 and the small-diameter pillar-like portion 27b of the second contact member 27 is inserted into the small-diameter holding portion 19c of the holding opening 19a of the lower-side holding member 19 and projected downward.

The step portion 26c of the first contact member 26 abuts on a top wall of the large-diameter opening portion 18b of the upper-side holding member 18, being able to prevent the first contact member from falling off upward. On the other hand, the step portion 27d of the second contact member 27 abuts on a bottom wall of the large-diameter opening portion 19b of the lower-side holding member 19, being able to prevent the second contact member from falling off downward.

Next, shape forming of the first contact member 26 of the contact pin 15 will be explained hereunder.

Figure 2:
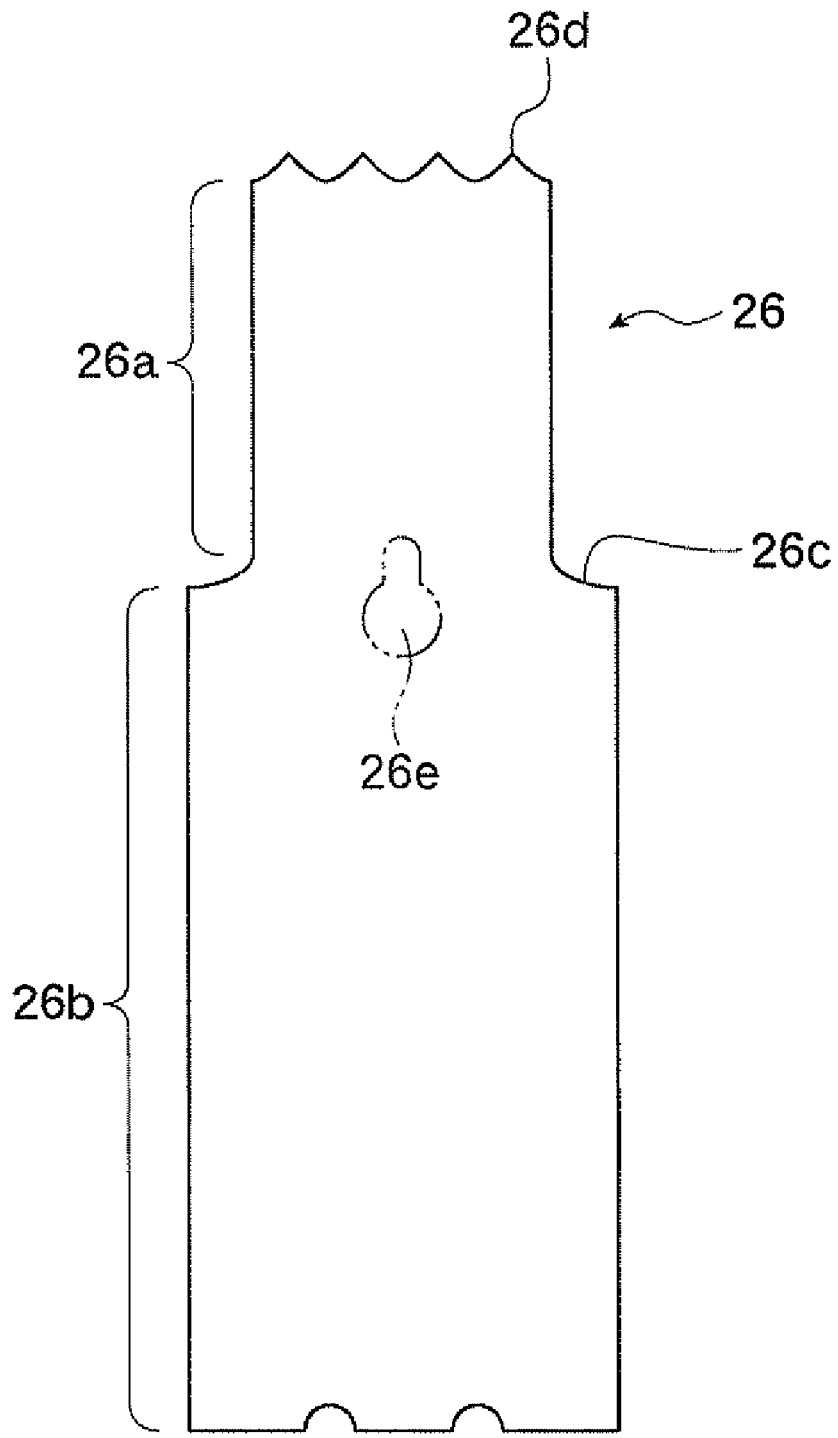
FIG. 2 is a development view of a first contact member of the first embodiment.
Figure 3A:
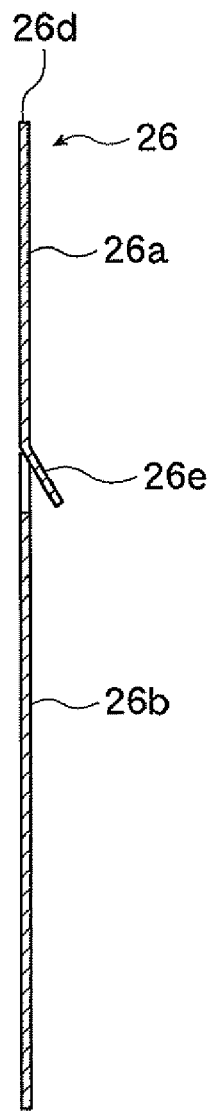
FIGS. 3A to 3C are sectional views of a pressing process of the first contact member of the first embodiment.
Figure 3B:
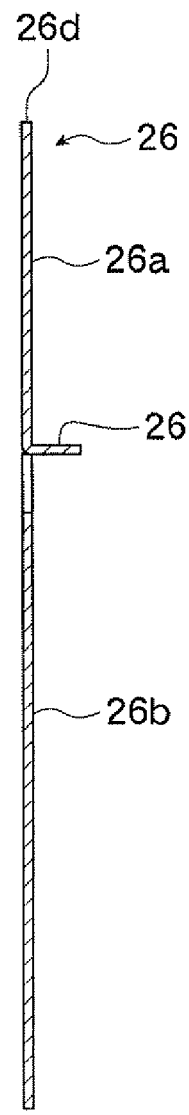
Figure 3C:
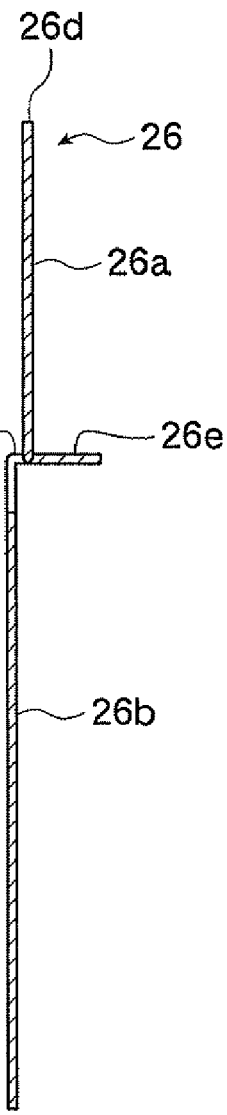

Firstly, a shape shown in FIG. 2 is punched out from the electroconductive plate. At this stage, the punched out electroconductive plate is formed into a mountain like shape corresponding to the crown-like first contact portion 26d and the cutting and bending of the blocking piece 26e as shown in FIG. 3A are carried out. Next, as shown in FIG. 3B, the blocking piece 26e is bent by about 90 degrees with respect to the small-diameter cylindrical portion and then as shown in FIG. 3C, step-like bending work of a portion corresponding to the step portion 26c is carried out.

Figure 4A:
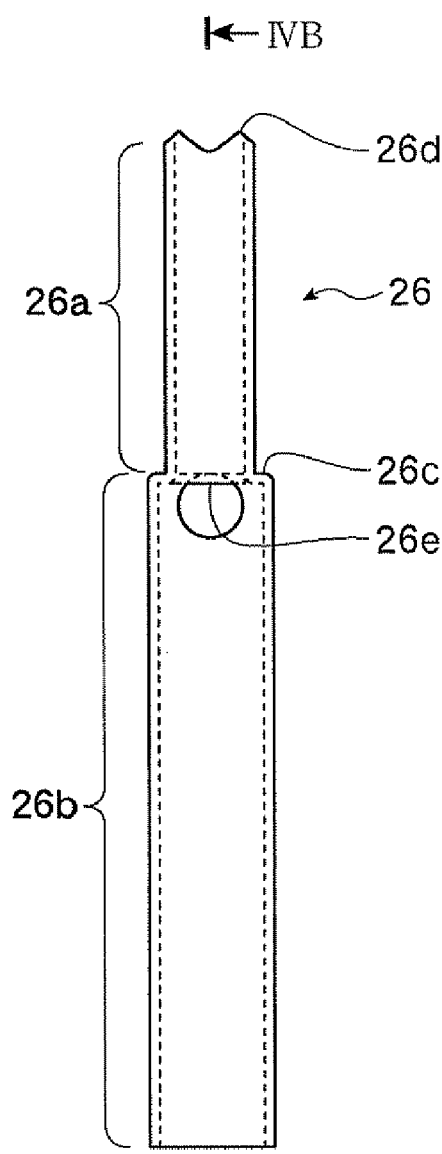
FIGS. 4A and 4B represent a state after the first contact member of the first embodiment is bended.
Figure 4B:
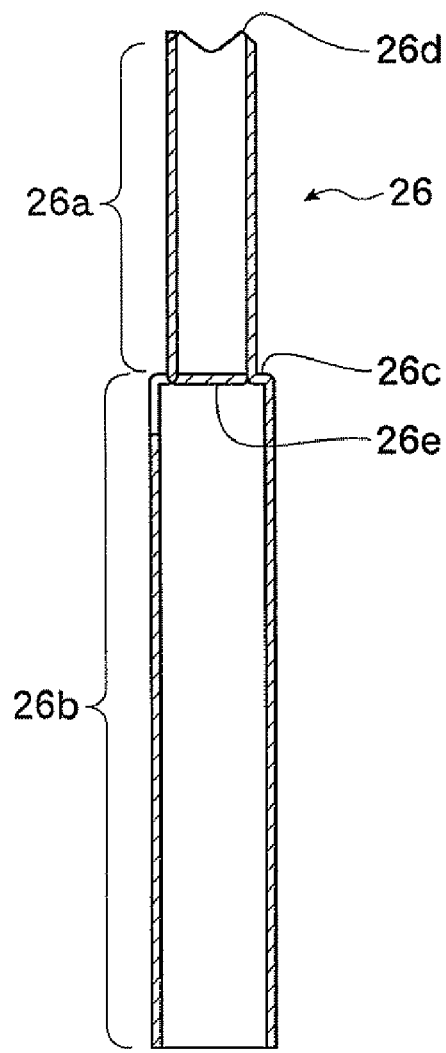

Then, as shown in FIGS. 4A and 4B, shape forming of the cylinder-like first contact member 26 is completed through curling (bending) process.

The coil spring 28 is then accommodated into the large-diameter cylindrical shape portion 26b of the thus formed first contact member 26 which is shaped through the processes mentioned above. And then the large-diameter pillar-like portion 27a of the second contact member 27 is inserted into the large-diameter cylindrical shape portion 26b of the first contact member 26. Thus, the assembling processes of the contact pin 15 are completed.

Next, with the upper-side holding member 18 and the lower-side holding member 19 being divided, the contact pin 15 is inserted into one of the holding openings 18a and 19a and then both holding members 18 and 19 are combined together. Thus the assembling process of the socket is completed.

Next, operations and functions of the socket body will be explained hereunder.

Firstly, accommodation of the IC package 12 will be explained. The IC socket 11 is, preliminarily, mounted on the wiring board 13 so that the electrode portion 13a of the wiring board 13 is abutted on the second contact portion 27e of the second contact member 27. At this stage, the second contact member 27 of the contact pin 15, which projects downward from the socket body 14, is pushed by the wiring board 13 and is inserted into the inner side of the socket body 11 (not shown).

Under this state, the IC package 12 is delivered by, for example, an automated machine and accommodated on the floating plate 20 (see FIG. 1). At this time, the IC package 12 is mounted at a predetermined position on the floating plate 20, then the solder ball 12a is inserted into an insertion hole 20a of the floating plate 20.

Under this state, the IC package 12 is depressed for example by the automated machine (not shown). Therefore, the floating plate 20 is depressed against an urging force of the spring (not shown) and the solder ball 12a abuts on the first contact portion 26d of the first contact member 26 of the contact pin 15. Thus the first contact member 26 is moved downward against the urging force of the coil spring 28.

According to this operation, the contact pin 15 is compressed against the urging force of the coil spring 28. The first contact portion 26d is contacted with the solder ball 12a of the IC package 12 and at the same time, the second contact portion 27e is contacted with the electrode portion 13a of the wiring board 13 by the reactive force under a prescribed pressure, respectively.

Then the electrical connection between the IC package 12 and the wiring board 13 is established through the contact pin 15, and then burn-in test, etc. are carried out.

Figure 5:
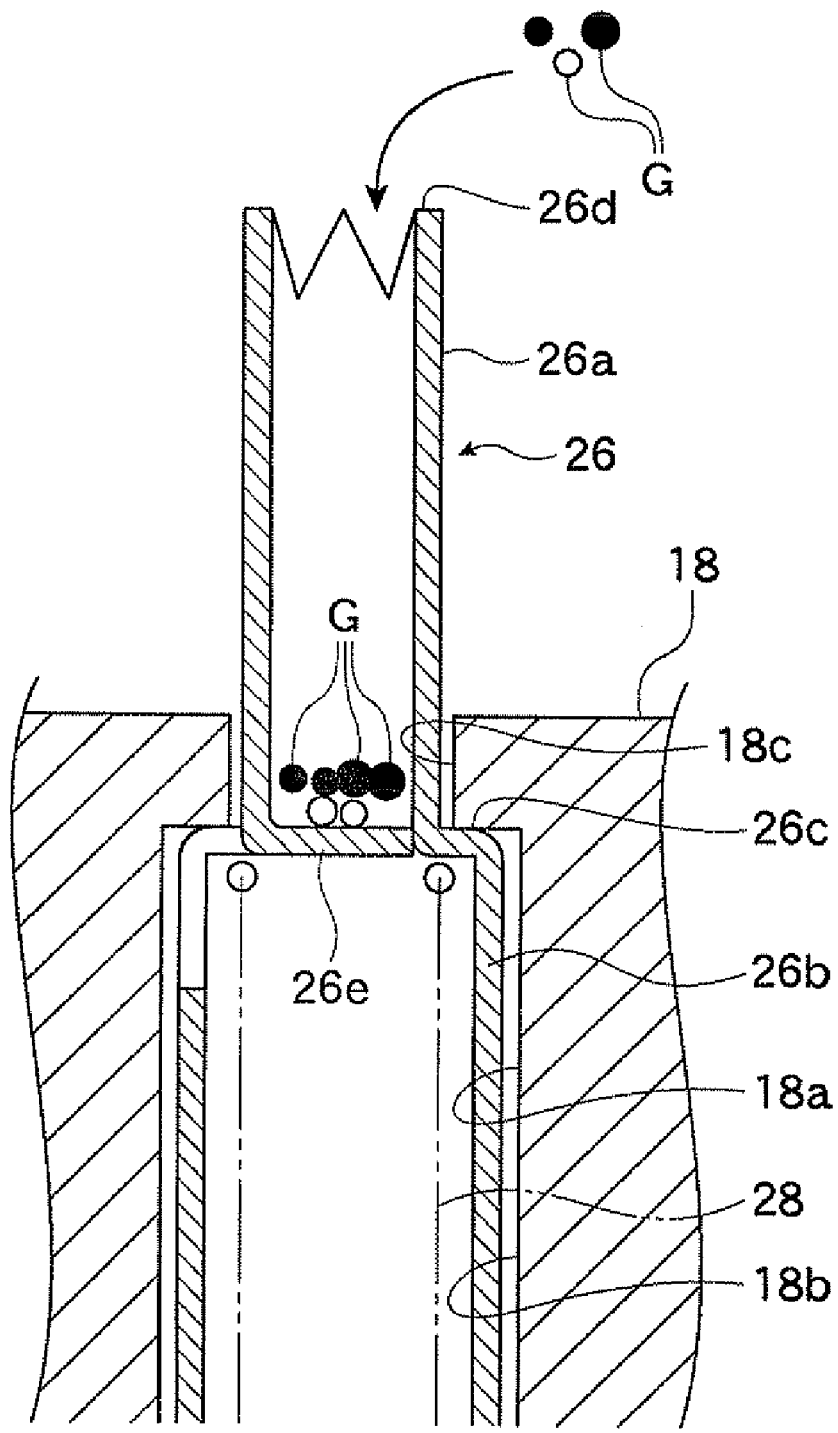
FIG. 5 is a sectional view showing an operation of the first contact member of the first embodiment.

In this case, as shown in FIG. 5, when foreign materials (G) enter from an upper-end opening of the cylinder-like first contact member 26, the foreign material (G) will pile up on the blocking piece 26e and will not fall down to the coil spring 28 located just below the blocking piece and also will not reach the second contact member 27. Accordingly, the foreign materials (G) are not bitten by the coil spring 28 or the second contact member 27 etc., being able to prevent such problem as poor electrical connection, poor operability etc. from occurring.

In addition, the blocking piece 26e can be formed in one body at the time of shape forming of the first contact member 26, being easier to produce and cost efficient when compared with other methods for preventing the intrusion of foreign materials (G).

Since the second contact member 27 of the contact pin 15 is inserted into and contacted with the first contact member 26, an electric current can flow easier than a case where electric current flows only through the coil spring 28, and high frequency characteristics can also be improved. Of course, in the present invention, an electric current also flows through the coil spring 28.

Further, the first contact member 26 is formed into a cylindrical shape through a curling process using an electroconductive plate, being cost efficient, easy to produce and light in weight, because it is not formed through a cutting work.

Further, the crown-like first contact portion 26d of the first contact member 26 can be formed much easily through the pressing process when compared with the cutting work.

Further, the upper end portion 27c of the second contact member 27 is formed into a taper-like shape and the coil spring 28 is positioned so as to fit the coil spring to the upper end portion 27c. Therefore, the coil spring 28 is not bitten into a sliding portion between the first and the second contact member 26, 27. Accordingly, smooth retracting operations of the first and the second contact member 26, 27 can be realized.

Second Embodiment

Figure 6:
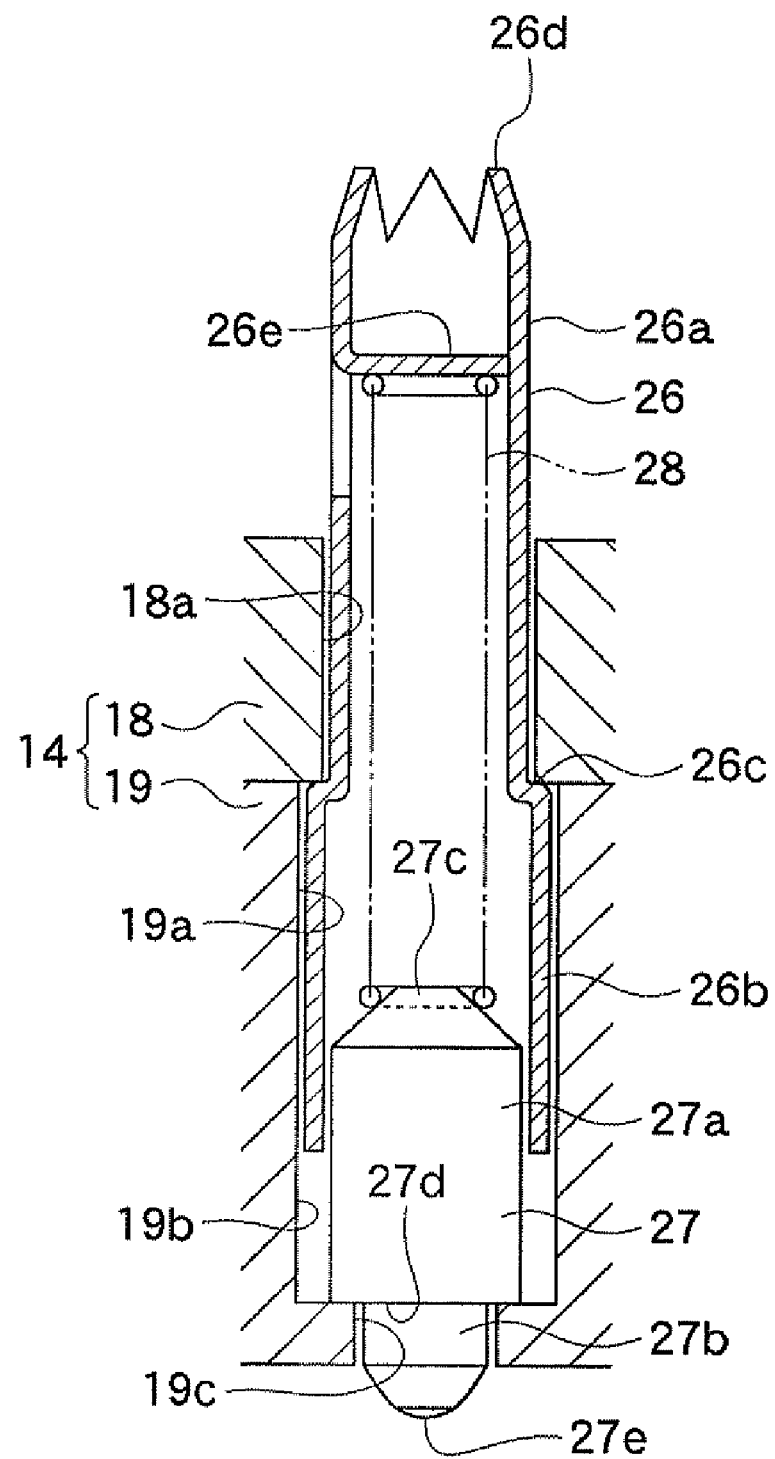
FIG. 6 is a sectional view of the second embodiment corresponding to FIG. 1.

FIG. 6 represents a second embodiment of the present invention.

In the second embodiment, the blocking piece 26e of the first contact member 26 is formed at a position different from that of the first embodiment.

That is, the first contact member 26 has a small-diameter cylindrical shape portion 26a, the length of which is longer than that of the large-diameter cylindrical shape portion 26b. The blocking piece 26e is formed at a portion close to and under the first contact portion 26d of the upper end portion of the small-diameter cylindrical shape portion 26a.

Other structures and operations of this second embodiment are substantially similar to those of the first embodiment, so that the details thereof are omitted herein.

Third Embodiment

Figure 7:
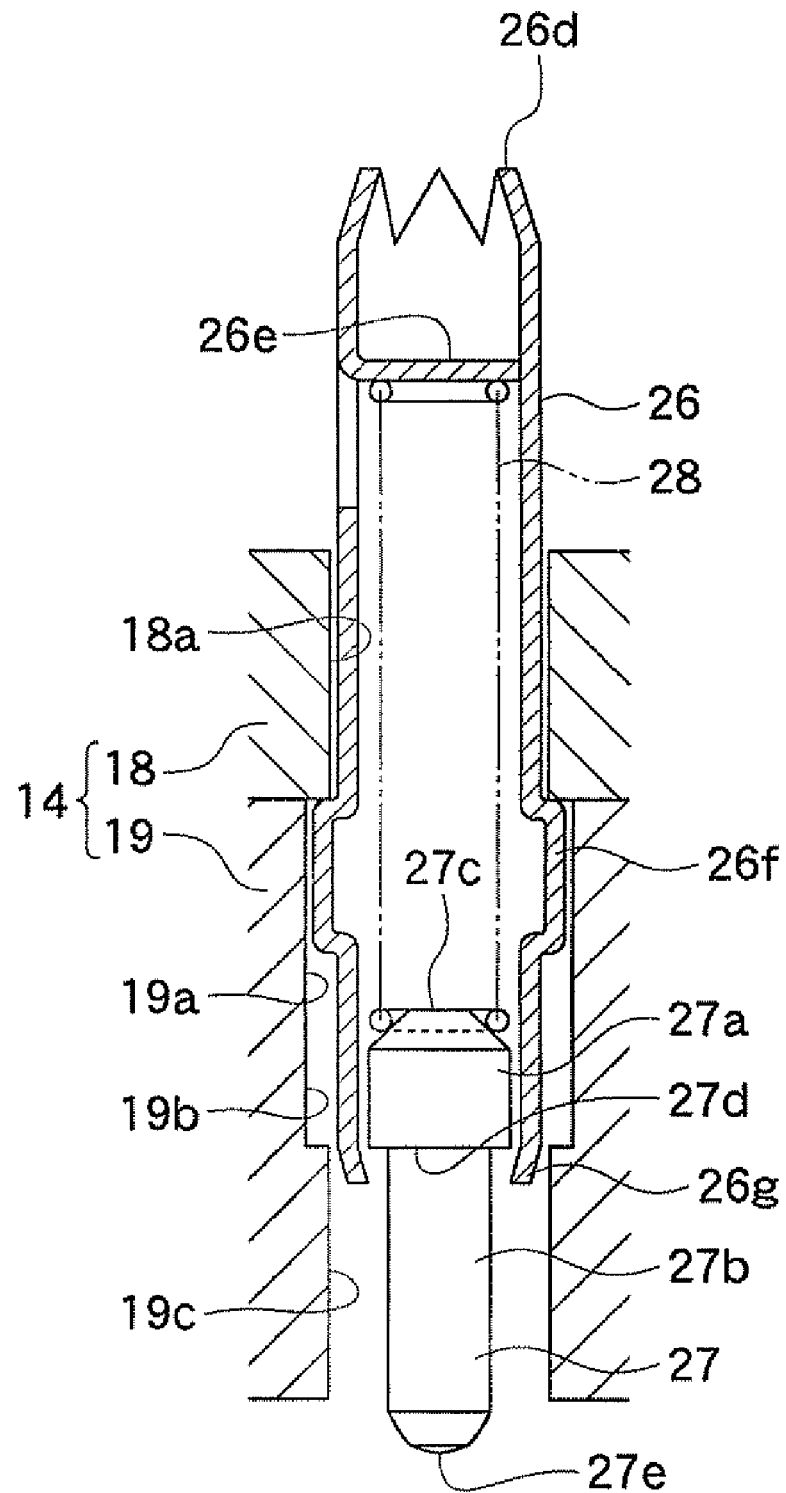
FIG. 7 is a sectional view of the third embodiment corresponding to FIG. 1.

FIG. 7 represents a third embodiment of the present invention.

In the third embodiment, the structures of the first contact member 26 are different from that of the second embodiment.

That is, the first contact member 26 has a bulged portion 26f formed at a middle portion along the vertical direction. The bulged portion has a larger diameter than that of the other portions. The bulged portion 26f is disposed in the large-diameter opening portion 19b of the lower-side holding member 19. Slipping off of the contact pin in the vertical direction is limited by this bulged portion 26f.

In addition, the diameter of the lower end portion 26g of the first contact member 26 is made small by caulking in such a way that the second contact member 27 can not slip off the first contact member. Therefore, handling of the contact pin 15 becomes easier because the first and the second contact member are joined in one body at the time the contact pin is not arranged in the socket body 14.

Other structures and operations of this third embodiment are substantially similar to those of the first embodiment, so that the details thereof are omitted herein.

Fourth Embodiment

Figure 8:
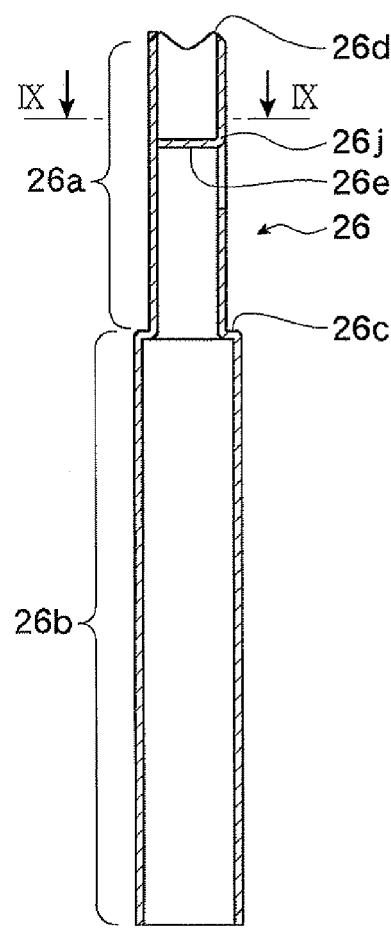
FIG. 8 is a sectional view of the first contact member of the fourth embodiment corresponding to FIG. 4B.
Figure 9:
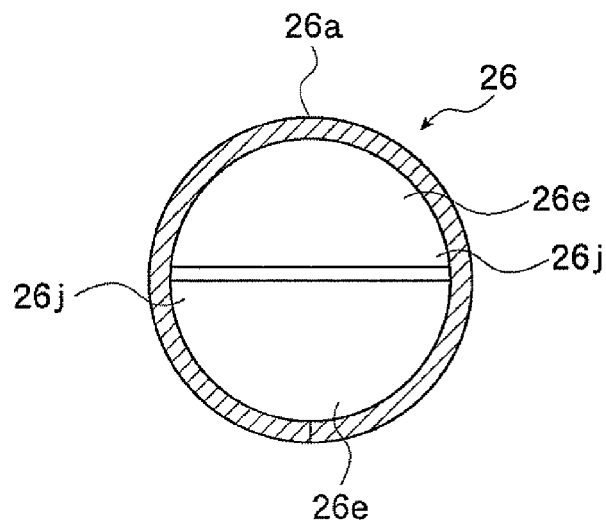
FIG. 9 is an enlarged sectional view taken along the line IX-IX in FIG. 8 of the fourth embodiment.
Figure 10:
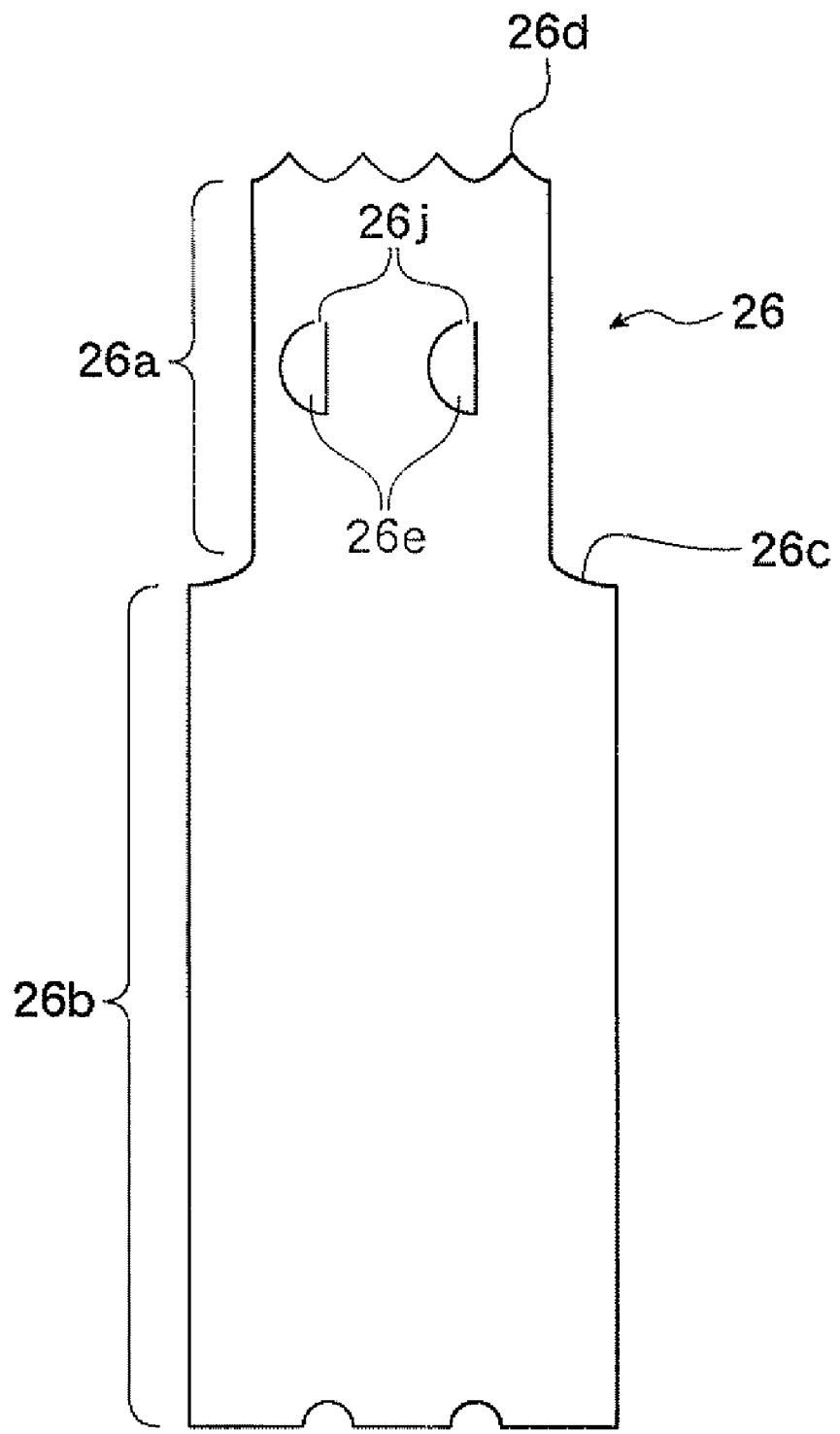
FIG. 10 is a development view of the first contact member of the fourth embodiment corresponding to FIG. 2.

FIGS. 8 to 10 represent a fourth embodiment of the present invention.

In the fourth embodiment, the structures of the first contact member 26, especially the structures of the blocking piece 26e, are different from that of the first embodiment.

That is, the first contact member 26 has a small-diameter cylindrical shape portion 26a on which a pair of blocking pieces 26e is formed. Each of the blocking pieces 26e is formed into a semicircular shape. These pieces are bent as shown in FIG. 8 approximately horizontally to combine with each other so that as shown in FIG. 9, the pair of blocking pieces look like as a circular shape in a plan view and is structured to block the inside of the small-diameter cylindrical shape portion 26a.

Such first contact member 26 mentioned above can be formed, as shown in FIG. 10, by, at first, obtaining a predetermined shape from a spread-out plane plate through press working. Then a pair of approximately semicircular-shaped blocking pieces 26e, which is connected with other portion of the press-worked plate by way of a connecting portion 26j, are bent up to have a right angle with respect to the other portion of the press-worked plate.

After that, the press-worked plate member is rolled to form the small-and the large-diameter cylindrical shape portion 26a, 26b in such a manner that the pair of semicircular-shaped blocking pieces 26e, 26e are combined with each other to form, in a plan view, a circular shape which block the inside of the small-diameter cylindrical shape portion 26a. Thus the shape forming of the first contact member 26 is completed.

In this case, too, when foreign materials enter into the contact pin through an upper-end opening of the cylinder-like first contact member 26, the foreign materials (G) will pile up on the blocking pieces 26e, 26e and will not further fall down to the coil spring 28 located just below the blocking piece and will not reach the second contact member 27. Accordingly, the foreign materials (G) are not bitten by the coil spring 28 or the second contact member 27 etc., being able to prevent such problems as poor electrical connections, poor operability, etc. from occurring.

In addition, the blocking piece 26e can be formed in one body at the time of shape forming of the first contact member 26, being easier to manufacture and cost efficient when compared with other methods for preventing intrusion of the foreign materials (G).

Other structures and operations of this fourth embodiment are substantially similar to those of the first embodiment, so that the details thereof are omitted herein.

Fifth Embodiment

Figure 11:
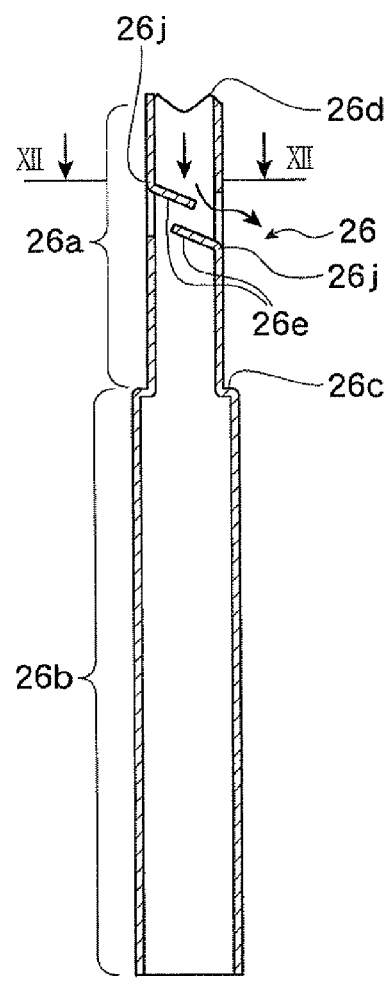
FIG. 11 is a sectional view of the first contact member of the fifth embodiment corresponding to FIG. 4B.
Figure 12:
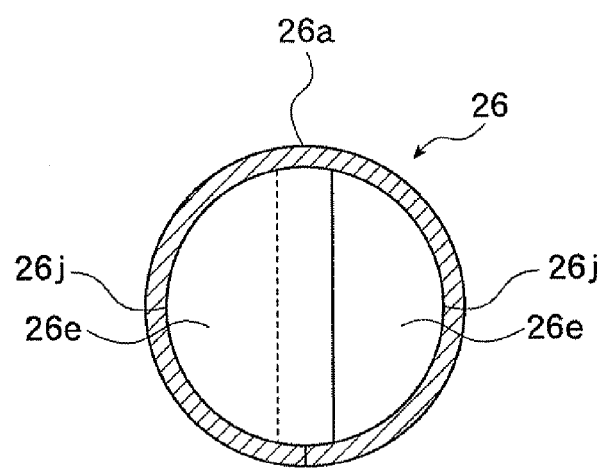
FIG. 12 is an enlarged sectional view taken along the line XII-XII in FIG. 11 of the fifth embodiment.
Figure 13:
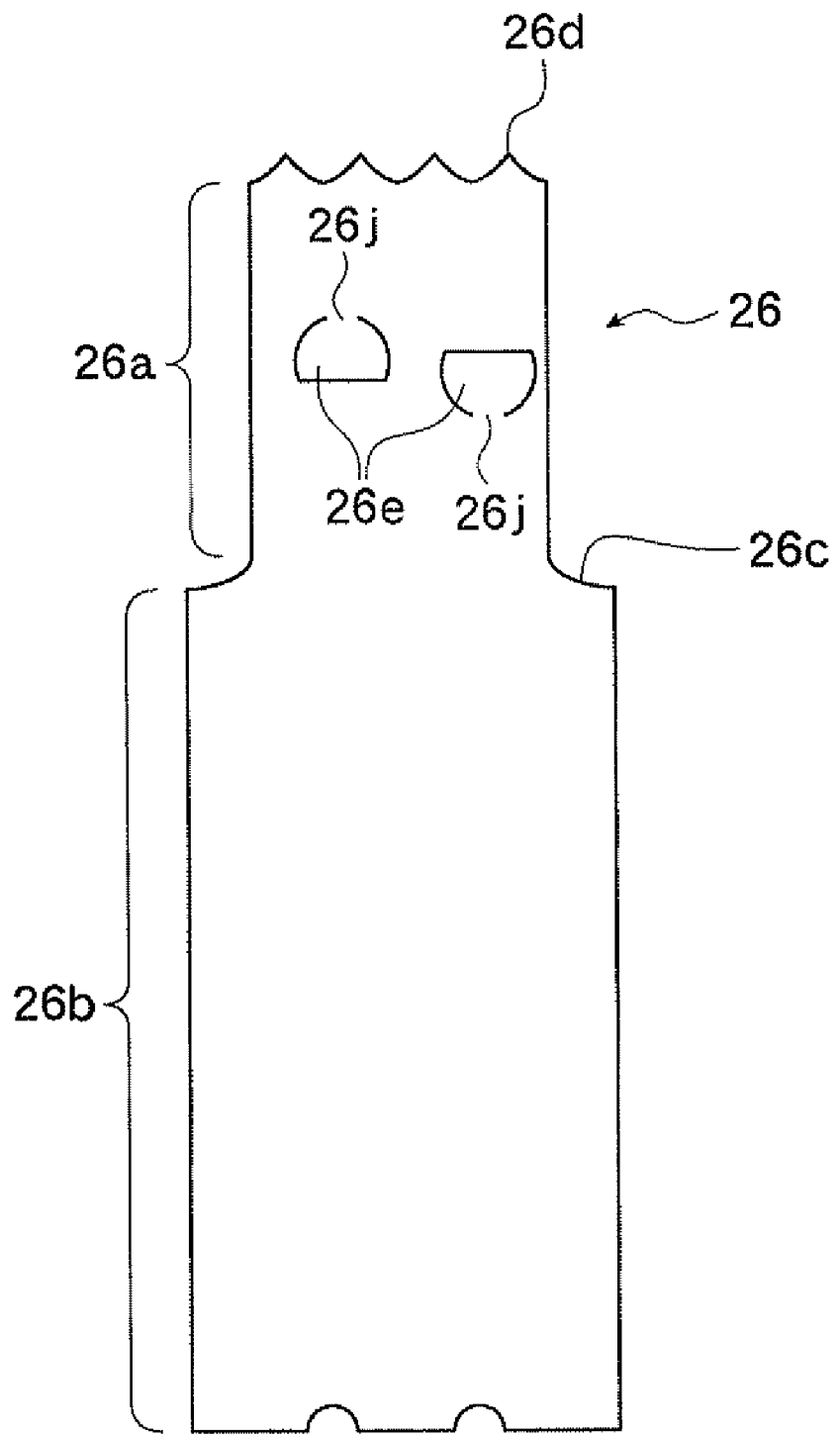
FIG. 13 is a development view of the first contact member of the fifth embodiment corresponding to FIG. 2.
Figure 14:
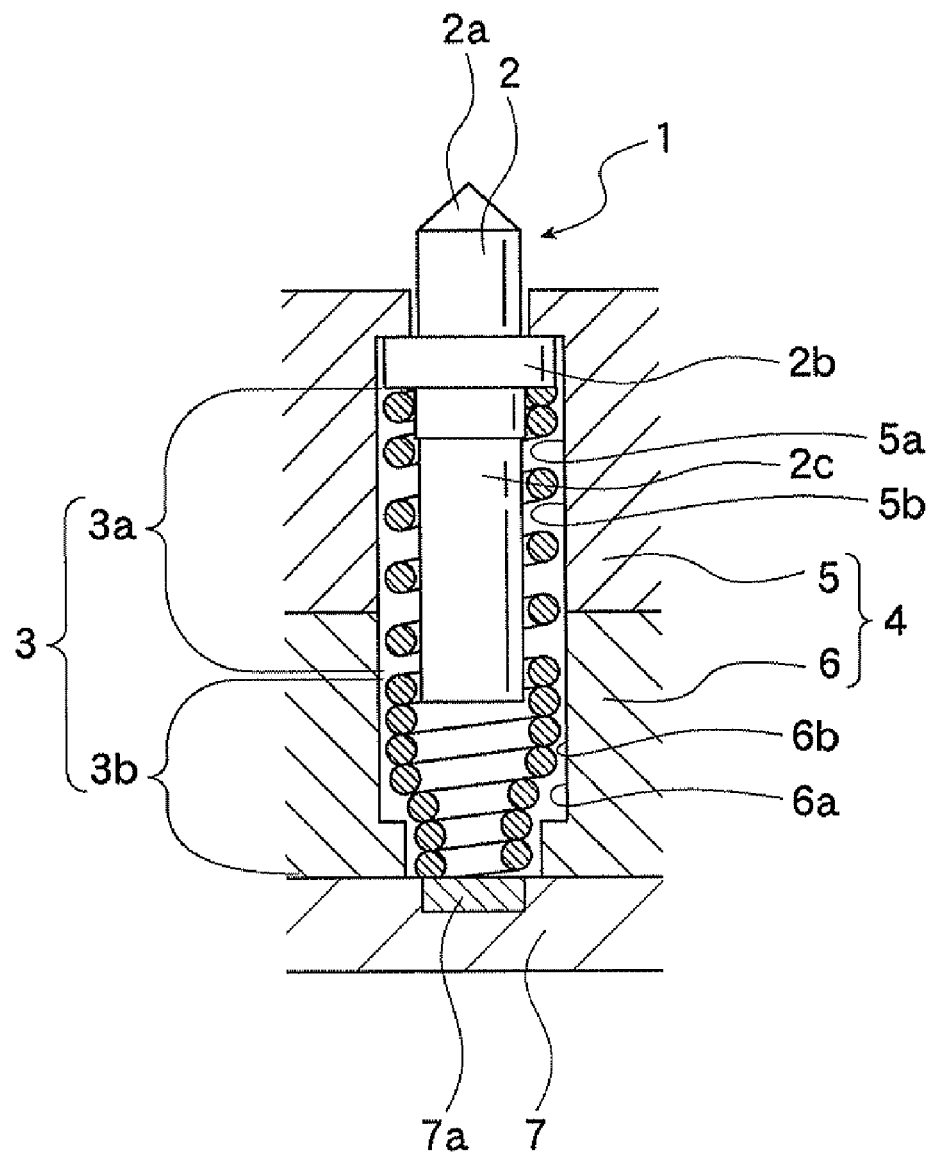
FIG. 14 is an enlarged sectional view of a conventional contact pin.

FIGS. 11 to 13 represent a fifth embodiment.

In the fifth embodiment, the structures of the first contact member 26, especially the structures of the blocking piece 26e are different from that of the first embodiment.

That is, the first contact member 26 has a small-diameter cylindrical shape portion 26a on which a pair of blocking pieces 26e is formed. Each of the blocking pieces 26e is formed into a shape of circular arc somewhat larger than a semicircle having the same radius. Front edge portions of the blocking portions are structured, in a plan view, to be overlapped with each other so that the blocking pieces 26e can block the inside of the small-diameter cylindrical shape portion 26a.

Moreover, the paired blocking pieces 26e are inclined parallel to each other and each formed at a different height so that the foreign materials can be discharged outside from an opening 26k as shown by an arrow in FIG. 11.

Such first contact member 26 mentioned above can be formed into, as shown in FIG. 13, by, at first, obtaining a predetermined shape from a spread-out plane plate through press working. Then a pair of approximately semicircular-shaped blocking piece 26e, which is connected with the other portion of the press-worked plate by way of a connecting portion 26j, are bent up to have a predetermined angle with respect to the other portion.

Then the press-worked plate member is rolled to form the small- and the large-diameter cylindrical shape portion 26a, 26b, in such a manner that the pair of approximately semicircular-shaped blocking pieces 26e become, in a plan view, a circular shape which block the inside of the small-diameter cylindrical shape portion 26a. Thus the shape forming of the first contact member 26 is completed.

In this case, too, when the foreign materials enter into the contact pin from an upper-end opening of the cylinder-like first contact member 26, the foreign materials slide down on the blocking piece 26e, 26e and are discharged outside from the opening 26k, so that the foreign materials will not fall down to and intrude into the coil spring and the second contact member. Accordingly, the foreign materials are not bitten by the coil spring or the second contact member etc., being able to prevent such problems as poor electrical connections, poor operability etc. from occurring.

In addition, the foreign materials can be discharged outside, so that the foreign materials will not stay inside the first contact member 26. Therefore, inconveniences caused by the foreign materials can be effectively prevented even when it is used for a long term.

Furthermore, the blocking piece 26e can be formed in one body at the time of the shape forming of the first contact member 26, accordingly it can be produced easily at lower cost.

Other structures and operations of this fifth embodiment are substantially similar to those of the first embodiment, so that the details thereof are omitted herein.

In the above embodiments, the contact pin 15 as an "electrical contact" has the first contact member 26 and the second contact member 27 disposed under the first contact member. However, the second contact member 27 can be omitted. In such case, the coil spring 28 can be used as an electrical contacting part which can contact the electrode portion 13a of the wiring board 13.

Further, in the embodiments mentioned above, the contact pin 15 as an "electrical contact" is applied to an IC socket 11, but the present invention is not limited to this application, but may be applied to other parts. The present invention is applied to an IC socket 11 for a BGA type IC package, but the present invention is not limited to this but can be applied to an IC socket for an LGA (Land Grid Array) type and a PGA (Pin Grid Array) type IC package having terminals on a lower surface thereof, and can be applied to an IC socket for a QFP (Quad Flat Package) type IC package having terminals extending from the side surface thereof.

Further, the socket for electrical parts according to this invention can be applied to what is called an open top type IC socket or an IC socket for electrical parts which are pushed by a pusher provided on the automated machine.

The invention claimed is:

1. An electrical contact which comprises a first contact member having a first contact portion to be contacted with a first electrical part, wherein
   the first contact member is formed into a cylindrical shape by curling an electroconductive plate, and
   a blocking piece is formed at a middle portion of the cylindrical shape by making a cut in the middle portion, the blocking piece being bent toward an inside of the cylindrical shape in such a manner that the blocking piece, in a plan view, blocks a through hole that runs vertically through the inside of the cylindrical shape.

2. An electrical contact which comprises:
   a first contact member having a first contact portion to be contacted with a first electrical part;
   a second contact member having a second contact portion to be contacted with a second electrical part, the second contact member being disposed at a lower side of the first contact member; and
   an urging means for urging the first and the second contact member in a direction opposite to each other, wherein,
   the first contact member is formed into a cylindrical shape by curling an electroconductive plate,
   a blocking piece is formed at a middle portion of the cylindrical shape by making a cut in the middle portion, the blocking piece being bent toward an inside of the cylindrical shape in such a manner that the blocking piece, in a plan view, blocks a through hole that runs vertically through the inside of the cylindrical shape.

3. The electrical contact according to claim 1, wherein the first contact portion of the first contact member is formed into a crown-like shape.

4. The electrical contact according to claim 1, wherein a plurality of blocking pieces are formed on the first contact member and the plurality of blocking pieces, in a plan view, block the through hole that runs vertically through the inside of the cylindrical shape.

5. A socket for an electrical part which comprises:
   a socket body to be disposed on a wiring board and to accommodate a first electrical part on an upper side of the socket body; and
   a plurality of electrical contacts according to any one of claims 1 to 4, which are disposed in the socket body.

* * * * *